(12) United States Patent
Levin et al.

(10) Patent No.: US 9,780,288 B2
(45) Date of Patent: Oct. 3, 2017

(54) METHOD OF ASSEMBLING AN ULTRASONIC TRANSDUCER AND THE TRANSDUCER OBTAINED THEREBY

(75) Inventors: Laurent Levin, Les Mesnuls (FR); Gustavo Greca, Creteil (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 816 days.

(21) Appl. No.: 14/233,637

(22) PCT Filed: Jun. 21, 2012

(86) PCT No.: PCT/FR2012/051411
§ 371 (c)(1),
(2), (4) Date: Sep. 23, 2014

(87) PCT Pub. No.: WO2013/011217
PCT Pub. Date: Jan. 24, 2013

(65) Prior Publication Data
US 2015/0028725 A1 Jan. 29, 2015

(30) Foreign Application Priority Data

Jul. 18, 2011 (FR) ...................................... 11 56506

(51) Int. Cl.
*H01L 41/083* (2006.01)
*H01L 41/047* (2006.01)
(Continued)

(52) U.S. Cl.
CPC ........ *H01L 41/0477* (2013.01); *B06B 1/0611* (2013.01); *H01L 41/0471* (2013.01);
(Continued)

(58) Field of Classification Search
CPC ............... H01L 41/083; H01L 41/0477; H01L 41/0472; H01L 41/277; H01L 41/297
(Continued)

(56) References Cited

U.S. PATENT DOCUMENTS 5,153,477 A    10/1992   Jomura et al.
7,982,371 B1 *  7/2011   Anand .................... F03G 7/005
                                                   310/330

(Continued)

FOREIGN PATENT DOCUMENTS

CN          1961381 A    5/2007
CN        101133501 A    2/2008
(Continued)

OTHER PUBLICATIONS

International Search Report Issued Oct. 2, 2012 in PCT/FR12/051411 Filed Jun. 21, 2012.
(Continued)

*Primary Examiner* — J. San Martin
(74) *Attorney, Agent, or Firm* — Oblon, McClelland, Maier & Neustadt, L.L.P.

(57) ABSTRACT

An ultrasonic transducer includes a stack of flat electrodes between which are interposed ceramic wafers of substantially same surface area as the electrodes, stacked contours of the ceramic wafers and electrode wafers defining substantially flat or cylindrical side faces of the stack. A method of manufacturing the transducer includes: alternatively stacking a ceramic wafer and an electrode wafer, placing between each ceramic wafer and its two neighboring electrodes a composition of which at least 75% by weight, or at least 80% by weight, that includes silver nanoparticles having a grain size of smaller than or equal to 80 nanometers, or smaller than or equal to 60 nanometers; and compressing the stack by heating to a temperature of less than or equal to 280° C., or between 200° C. and 250° C.

12 Claims, 2 Drawing Sheets

(51) Int. Cl.
*H01L 41/297* (2013.01)
*B06B 1/06* (2006.01)
*H01L 41/277* (2013.01)

(52) U.S. Cl.
CPC .......... *H01L 41/083* (2013.01); *H01L 41/277* (2013.01); *H01L 41/297* (2013.01); *H01L 41/0472* (2013.01)

(58) Field of Classification Search
USPC ........................................................ 310/328
See application file for complete search history.

(56) References Cited

U.S. PATENT DOCUMENTS

| | | | |
|---|---|---|---|
| 2006/0255692 A1 | 11/2006 | Yasui | |
| 2007/0052765 A1 | 3/2007 | Yasui | |
| 2009/0033179 A1 | 2/2009 | Ito et al. | |
| 2011/0297422 A1* | 12/2011 | Cho | H05K 1/0269 174/250 |
| 2012/0015472 A1* | 1/2012 | Hayashi | H01L 31/048 438/80 |
| 2012/0043858 A1* | 2/2012 | Mahapatra | B82Y 15/00 310/339 |
| 2012/0055918 A1* | 3/2012 | Yue | H05B 3/34 219/552 |
| 2014/0221543 A1* | 8/2014 | Wang | B22F 1/0018 524/403 |

FOREIGN PATENT DOCUMENTS

| | | |
|---|---|---|
| DE | 10 2008 048 051 | 4/2010 |
| DE | 10 2007 058 874 | 5/2010 |
| EP | 1 705 016 | 9/2006 |
| JP | 62-199074 A | 9/1987 |
| WO | WO 2005/079353 A2 | 9/2005 |

OTHER PUBLICATIONS

French Search Report Issued Feb. 21, 2012 in FR 11 56506 Filed Jul. 18, 2011.

* cited by examiner

METHOD OF ASSEMBLING AN ULTRASONIC TRANSDUCER AND THE TRANSDUCER OBTAINED THEREBY

The subject of the invention is a piezoelectric or magnetostrictive transducer, notably a transducer suitable for working at an ultrasound frequency.

More particularly, the subject of the invention is a transducer that can be used as actuator of a heat engine fuel injector.

The fuel injectors that use such ultrasound actuators are, for example, described in the patent applications FR 2 941 746, FR 2 936 025, FR 2 936 024, FR 2 918 123, FR 2 889 257. Such injectors make it possible to spray the fuel very finely and optimize the combustion of a direct injection engine.

Such an improvement in the spraying can in particular limit the quantity of particulates emitted by the vehicle.

An ultrasound transducer typically consists of a stack, in which a piezoelectric ceramic layer is each time "sandwiched" between two electrodes, connected to two different terminals of an electrical power source. The range of operation (frequency, transmitted force) of transducers suited to fuel injectors requires a stack of relatively thick ceramics (typically from 1 to 5 mm thickness of ceramic between two electrodes). Such stacks can be produced by alternately stacking a thickness of ceramic and a thickness of electrode, with no binder material between the two thicknesses. The surface finish of the ceramics and of the electrodes must then be carefully ground, with a submicronic tolerance in order to limit the stress concentrations generated in the areas of contact between the electrodes and the ceramics, during the compression of the stack.

In order to reduce the production costs, alternative production methods are proposed, such as, for example, producing the electrodes by brazing a composite paste, based on silver powder, the braze being applied at a temperature of approximately 600° between two successive ceramic layers.

The surface finish of the electrode is thus suited to the surface finish of the ceramic. However, the brazing temperature is then greater than the Curie temperature of the piezoelectric ceramic. After the brazing operation, the transducer must therefore be once again subjected to a high electrical field, in order to restore the piezoelectric properties of the ceramic. The operation of repolarizing the ceramic is accompanied by dimensional changes (inflation) which generate residual shear stresses at the interface between the brazed electrode and the ceramic.

The residual stresses speed up the fatigue damaging mechanisms, notably by cracking at the interface, when the transducer is in use.

In addition to the residual stresses induced by the brazing at the interface between the ceramic and the brazing paste, and the problems of depolarization, the high brazing temperatures (of the order of 600°), if they are not applied sufficiently uniformly over the ceramic, can also cause, by differential expansion, microcracks in the ceramic itself.

The methods that use such brazing pastes are, for example, described in the patent applications JP 2 985 503 and JP 6 084 409. The brazing pastes used are respectively a composite paste based on silver powder, and a composite brazing paste based on ceramic powder coated with submicronic silver particles—that is to say silver particles of 500 nm or less.

In the latter case, the brazing temperature can be lowered to around 300° C., but the problems of depolarization of the ceramic elements remain.

The aim of the invention is to propose a method for assembling a transducer, notably an ultrasound transducer, which avoids having to perform a step of repolarizing the ceramics after the transducer has been assembled. To this end, the temperature of the ceramic has to be able to remain strictly less than 300° C., and, during periods in which the ceramic is exposed to a temperature greater than 100° C., the stresses undergone by the ceramic must not exceed 40 MPa so as not to damage the microstructure of the ceramic.

To this end, a method for fabricating a piezoelectric transducer, notably an ultrasound transducer, comprises the following steps. This method makes it possible to fabricate a stack of planar electrodes between which are interposed ceramic wafers with substantially the same surface area as the electrodes, the superposed contours of the ceramic wafers and of the electrode wafers define substantially planar or cylindrical side faces of the stack. The method notably comprises the following steps:

- a ceramic wafer and an electrode wafer are stacked alternately, placing between each ceramic wafer and its two adjacent electrodes, a composition, comprising at least 75% by weight, and preferably at least 80% by weight, of silver nanoparticles with a grain size less than or equal to 80 nanometers, and preferably with a grain size less than or equal to 60 nanometers,
- the stack is compressed by heating it to a temperature less than or equal to 280° C., and preferably between 200° C. and 250° C.

Preferentially, the size of the silver nanoparticles is between 10 nanometers and 60 nanometers.

Advantageously, the pressure is applied unidirectionally, perpendicularly to the ceramic wafers, at a value of between 2 and 20 MPa, and preferably between 5 to 10 MPa, for a duration less than or equal to 30 minutes and preferably less than or equal to 20 minutes.

According to a preferential embodiment, after placing the composition on the ceramic, the mean temperature of the stack is maintained, that is to say maintained throughout the duration of method until the functional transducer is obtained, below 280° C., and preferably below 250° C.

Preferentially, the composite is a paste. "Paste" should be understood here to mean a composition based on silver powder which is sufficiently malleable, even liquid, to be able to be spread on a planar support. The paste may, for example, be obtained by adding liquid components, or in gel form, to the powder of silver nanoparticles. A relatively fluid paste can be used so that its free surface is always planar in the rest state, which facilitates even coating.

In a preferred implementation, to place a layer of composition between a ceramic wafer and an electrode wafer, a support film is coated with the composition, the coated side of the support film is placed on the ceramic, then the film is removed. It is thus possible to coat a first face of the ceramic wafer, place it on an electrode, similarly coat the second face of the ceramic wafer, and place a second electrode above the ceramic wafer. Advantageously, before placing the film on the ceramic, the ceramic wafer is preheated to a temperature greater than or equal to 60° C., and preferably greater than or equal to 100° C.

According to a preferred embodiment, an initial stack is cut perpendicularly to the ceramic wafers, to obtain unitary stacks intended to different transducers, keeping, for the side face of at least one stack, a side face portion of the original stack. This side face of the initial stack is therefore used without grinding, machining or straightening cutting, to form certain surfaces of the final sides of the transducers fabricated from the initial stack. According to a variant embodiment, all of the initial stack is used to fabricate a single transducer, of which all the side faces are faces obtained following the operation of heating under pressure. Advantageously, following the compression and heating operation, the side faces are cleaned by a method of brushing or sandblasting type.

The electrodes interposed between the ceramic wafers at the ends of the stack are called separator electrodes.

According to a preferred embodiment, there are soldered on two faces of the unitary stack, each time, a side electrode which is placed in contact with one separator electrode in every two.

Separator electrodes can be used that have at least one connection tab dimensioned to extend beyond the stack.

According to an advantageous embodiment, square separator electrodes are used that have four connection tabs, two first tabs on a first face of the square and two second tabs on an opposite second face of the square. The stack is produced by staggering each electrode by +−90° relative to the preceding electrode, and the stack is then cut into four unitary stacks each provided with two rows of tabs on two adjacent faces.

According to another aspect, an ultrasound transducer obtained by the method described, comprises a stack of ceramic wafers and of separator electrode wafers, in which:
  the ceramic wafers are thick layers at least 1 mm thick, and preferably at least 2 mm thick,
  the electrode wafers are metallic layers of rolled metal or of dense metal, at least 20 micrometers thick, preferably at least 50 micrometers thick. "Dense metal" should be understood to mean a non-porous metal, obtained for example by rolling or forging from a cast mass, unlike a sintered metal whose structure sometimes allows a trace of the contours of the initial grains of the sintered powder to remain, because of the distribution and/or of the form of certain residual voids. The electrodes can be produced in copper-beryllium alloy, in titanium, in titanium alloy, or silver or in silver alloy. Advantageously, the electrode is taken from a rolled plate, for example annealed rolled silver. Preferentially, the electrode layers have a thickness less than or equal to 1 mm,
  between each ceramic wafer and the adjacent electrode or the adjacent electrodes, there is an intermediate layer of silver at least 10 micrometers thick, and preferably between 15 and 50 micrometers thick, covering at least 95% of a face of the ceramic wafer arranged facing the electrode.

By applying the method described previously, it is possible to obtain a transducer stack in which at least one interlayer of silver has on average a void ratio less than 10% by surface area on a cross-sectional view at right-angles through the ceramic wafers, and preferably a void ratio less than or equal to 5% by observed surface area, the maximum diameters—i.e. the maximum dimensions—of the voids being less than or equal to 5 micrometers, and preferably less than or equal to 2 micrometers. An interface between the ceramic wafer and the layer of silver can be obtained which is free of voids over more than 90%>, and preferably over more than 95% of the interface length. The interface between the separator electrode and the layer of silver can also exhibit an excellent level of cohesion, typically is free of voids over more than 90% of the interface length. Given these quantifications, the sample used for observation must obviously have been prepared with sufficient precautions to avoid subsequent decohesion of the ceramic from the layer of silver during the preparation of the sample. It can, for example, be considered that the observed void ratio of the layer of silver and the observed void ratio at the interfaces of the layer of silver is representative, if the length of the portion of silver layer visible in cross section has a length greater than or equal to 5 mm. Preferentially, the transducer comprises only metallic layers between two successive ceramic layers, that is to say the electrode and the intermediate layer of silver. The metal of the intermediate layer of silver is preferably silver with a purity of more than 99%.

According to a preferred embodiment, the transducer comprises two side electrodes which are each in electrical contact with one separator electrode in every two, that is to say with a single separator electrode adjoining one and the same ceramic wafer. Each side electrode can have a rippled form, so as to leave a gap of at least 0.5 mm, and preferably of at least 1 mm, between the side electrode and the separator electrodes to which it is not connected.

According to an advantageous embodiment, each separator electrode comprises at least one tab extending beyond the stack, the transducer comprising two side electrodes which are each in electrical contact with the tab of one separator electrode in every two.

In this embodiment, in the face of the transducer bordered by the side electrode, the outcrops of the intermediate layer of silver are rectilinear or concave over a cross-sectional view at right angles to the ceramic wafers.

According to a preferred embodiment, the ceramic wafers are planar pellets whose smallest dimension is preferably greater than or equal to 7 mm, and preferably greater than or equal to 12 mm, the pellets being covered by a silver paste over a portion of their surface area greater than or equal to 99%.

According to a preferred embodiment, the stack has a height greater than or equal to 30 mm. For this, the transducer comprises at least six ceramic wafers in the stack.

Other aims, features and advantages of the invention will become apparent on reading the following description, given purely as a nonlimiting example, and with reference to the appended drawings, in which.

Figure 1:
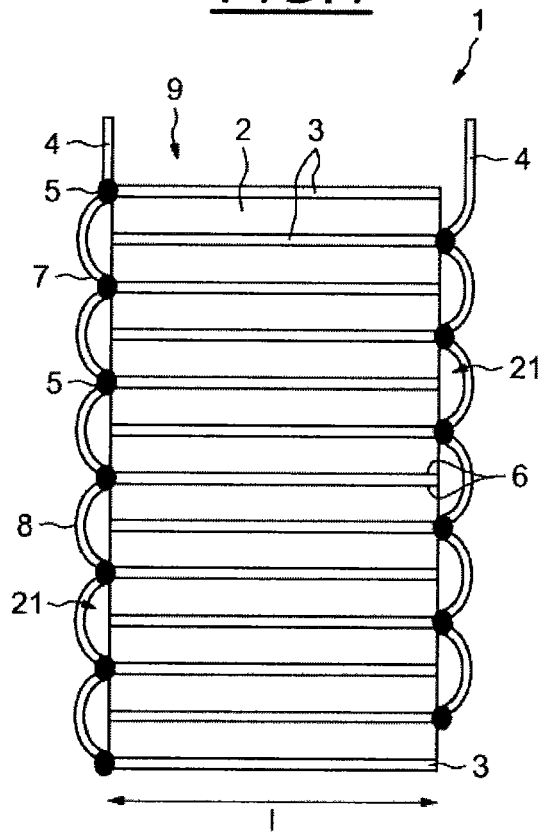
FIG. 1 is a front view of a transducer according to the invention.

FIG. 1 is a schematic view of a transducer according to the invention. The transducer 1 comprises ceramic wafers 2, for example piezoelectric ceramic wafers, alternating with electrodes 3. At the interface of the ceramics 2 and of the electrodes 3, thin link layers 6 are deposited, typically between 10 and 15 micrometers thick, and preferably between 10 and 30 micrometers thick. The electrodes are cut from rolled metal plates, for example from annealed silver sheets or from copper-beryllium alloy sheets, or even from titanium alloy sheets. The thickness of each intermediate electrode is greater than 20 micrometers, and preferably between 50 micrometers and 1 mm.

The thickness of the ceramics, which form wafers of substantially rectangular or square outline, is typically between 1 and 5 mm in order to be able to operate in the stress and frequency ranges required to produce a fuel injector. The width "l" of the stack 9, comprising the alternation of ceramic wafers and of electrode wafers, is approximately 15 mm, and the height of this unitary stack can be of the order of 40 mm. The outlines of the ceramic wafers and the outlines of the electrode wafers are substantially identical so as to be able to be stacked one on top of the other. The outlines can be, for example, rectangular, square or circular. The side surface can notably comprise a plurality of planar faces 21. Slight offsets may exist between the outline of a ceramic wafer and the outlines of the adjacent electrode wafers.

Side electrodes 4, produced for example in the same type of material as the intermediate electrodes 3, are arranged along two faces of the unitary stack, at right angles to the ceramic wafers 2. The side electrodes are linked by solder spots 5 with one side electrode 4 in every two, so that the side electrode is electrically connected to just one face of each of the ceramic wafers 2. By applying an electrical voltage between the two side electrodes 2, it is thus possible to vary the height of the transducer 1.

The side electrodes 4 are produced from a strip of metallic tape that is rippled perpendicularly to the length of the tape, so that each ripple bottom 7 bears one or more solder spots 5 with one and the same separator electrode 3, and each ripple peak 8 distances the side electrode 4 from the separator electrode 3 to which this side electrode is not connected, so as to avoid any accidental contact between the two electrodes. Furthermore, this configuration allows for an elastic deformation of the bridges of material 8 joining two separator electrodes 3, which can thus follow the thickness variations of the ceramic wafers when the latter are electrically excited.

The amplitudes of the ripples of the side electrode 4 can be chosen so that the minimum distance between the side electrode 4 and the group of separator electrodes 3 to which it is not connected is greater than or equal to 0.5 mm, and preferably greater than or equal to 1 mm.

Figure 2:
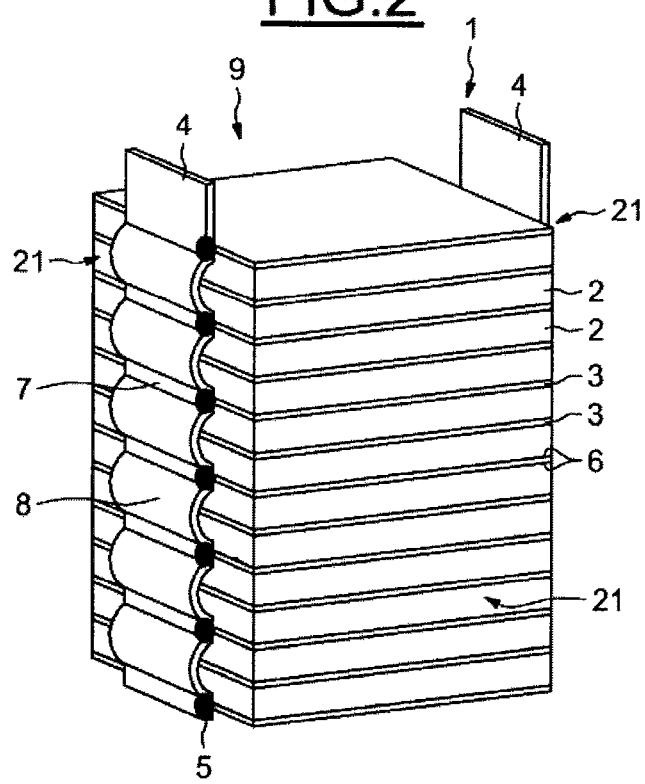
FIG. 2 is a perspective view of the transducer of FIG. 1.

FIG. 2 is a perspective view of the transducer of FIG. 1. FIG. 2 again shows elements common to FIG. 1, the same elements being designated by the same references.

It will be noted that in FIGS. 1 and 2, the side electrodes 4 are arranged on two opposite faces of the stack of ceramics and separator electrodes. According to other variant embodiments, these side electrodes could be soldered on two adjacent faces, even on one and the same face of the stack 9.

Figure 3:
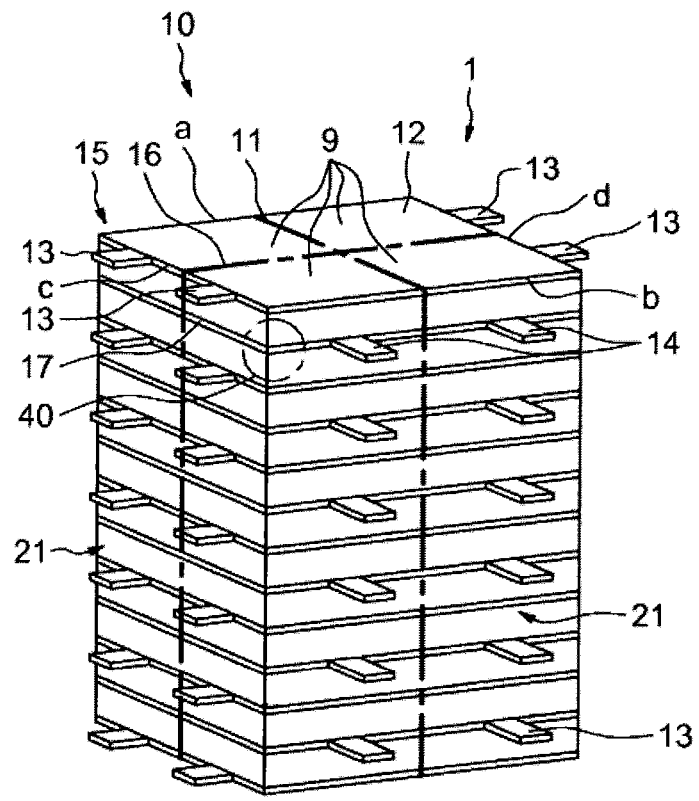
FIG. 3 is a view of a stack produced in the fabrication of another transducer according to the invention.

FIG. 3 is a perspective illustration of an initial stack 10 of ceramics and electrodes, produced in a process for fabricating a transducer according to the invention. FIG. 3 again shows elements common to FIGS. 1 and 2, the same elements then being designated by the same references. The initial stack 10 comprises a first end electrode 12 and a second separator electrode 17 linked to the same ceramic wafer. The end electrode 12, the second electrode 17, and the separator electrodes 3 as a whole, each bear four tabs. The four tabs 13 of the end electrode extend beyond the two opposite sides of a square 15 defining an outline of the ceramic wafers 2 of the stack 10.

The tabs 13 are arranged symmetrically relative to a median line 11. The median line 11 is both the median line of a first side a and of a second side b of the square, sides from which the tabs 13 extend. The tabs 13 are also arranged symmetrically relative to a second median line 16, which is both the median line of a third side c and of a fourth side d of the square 15. The median lines 11 and 16 are the plots of cutting planes along which the initial stack 10 is, in a subsequently step, for example with a diamond saw, separated into four unitary stacks 9.

The second electrode is an electrode identical to the first electrode 12 but is arranged staggered by a rotation angle of 90° relative to the first electrode 12. The second electrode comprises four tabs 15, which thus extend beyond the sides c and d of the square defining the outline of the ceramics 2.

The initial stack 10 is thus produced by alternately depositing a ceramic wafer, an electrode wafer—identical to the electrode 12—and by performing a rotation of plus or minus 90° every two electrodes, relative to the end electrode 12. The stack thus comprises odd electrodes whose tabs are aligned with the tabs 13 of the end electrode 12, and even electrodes whose tabs are aligned with the tabs 14 of the second electrode 17.

The stack 10 that can be seen in FIG. 3 is thus obtained. After cutting, this stack gives four unitary stacks 9, provided on a first face with tabs extending beyond all the electrodes of even order relative to the top electrode, and provided on an adjacent face with tabs extending beyond all the electrodes of odd order relative to the end electrode 12.

Two side electrodes 4 (not represented in FIG. 3) can then be connected to each series of tabs. FIG. 3 is not to scale: the size of the tabs is exaggerated relative to the other dimensions of the stack 10. In practice, the length of the tabs can be designed such that a tab, folded back along a side face of the stack 9, cannot touch the next electrode. It can for example be of a length slightly less than the thickness of a ceramic wafer. A tab can, for example, have a length of the order of a millimeter. According to variant embodiments, the length of the tabs can be greater than the thickness of the ceramic wafers, if the rigidity of the tabs is sufficient to avoid them being accidentally folded back along the outer face of the transducer, from which they extend.

In order to fill the flatness defects between each ceramic layer and its associated electrodes, a layer of silver obtained by sintering a silver nanopowder is introduced between each ceramic wafer and the adjacent electrodes. The silver nanopowders, typically silver powders with a grain size less than 80 nm, preferably with a grain size of between 20 and 60 nm, have the property of being able to be sintered in relatively low temperature conditions and at reduced pressures. In particular, the nanopowders with grain sizes of between 30 and 60 nm make it possible to obtain sintered structures with low residual porosity. "Sintering a metallic powder" should be understood to mean obtaining a solid metallic structure by heating and compressing the metallic powder, any non-metallic elements present in the powder being eliminated in heating.

A braze with the silver nanopowder can thus be obtained by applying to the stack a pressure of between 5 and 10 MPa in the stacking direction (direction at right angles to the ceramic wafers), at a temperature of between 200° C. and 220° C., for a duration of the order of minutes. By extension, the term braze is used, because even if the silver constituting the nanopowder does not pass through its "macroscopic" melting point, the creation of a compact mass and its adhesion to the ceramic and electrode interfaces, at the time of the sintering, gives a structure comparable to that which would be obtained by depositing molten silver between the electrode and the ceramic, and at a temperature lower than the melting point of the electrode (and of the ceramic).

The pressure can, for example, be applied by the plates of a press bearing on the end electrodes of the stack 10. The plates of the press can be preheated so as to transmit the necessary heat energy to the stack, and/or the stack can be preheated separately to be at a temperature close to the sintering temperature at the time of the application of the pressure stress. The application of pressure can also be done inside a heated chamber, notably encompassing the plates of the press.

In order to deposit the silver nanopowder, it is possible, for example, to proceed as follows. A support film treated with an antiadhesive material, for example PTFE or silicone, is coated with an even thickness, for example 100 micrometers, of silver paste. The silver paste in question contains mainly silver nanopowder in a proportion by weight exceeding 75%, up to proportions by weight that can be greater than 85%. The rest of the composition comprises notably binders, fluidifiers and surfactants. These components make it possible, on the one hand, to obtain a paste that is sufficiently manipulable for coating, and make it possible, on the other hand, to avoid a premature sintering of the silver nanograins, which could lead to an excessively porous structure of the final sintered mass. In fact, the "paste" can be relatively fluid, even liquid. Preferably, the different components are chosen so as to form a colloidal suspension of the silver nanograins, which notably avoids an anarchic agglomeration of the silver nanograins before the sintering operation.

The duly coated film is then brought into contact with one of the faces of a ceramic wafer, for example by means of a buffer which bears on the reverse (i.e. on the uncoated face) of the film. A residual layer of paste then remains attached to the ceramic. This layer has a thickness less than the initial coating thickness, for example has a thickness of the order of 20 micrometers.

The coated ceramic wafer can then be deposited on an electrode, or an electrode can be deposited on the ceramic wafer. The second face of a ceramic wafer already deposited on an electrode can in its turn be coated with paste in the same way, and a second electrode can be arranged above.

The outlines of the electrodes and of the ceramic wafers are substantially superposable, and, after stacking an alternation of ceramic and electrode wafers, a substantially rectangular parallelepipedal block is obtained, such as, for example, the stack 9 of FIGS. 1 and 2, or the stack 10 of FIG. 3.

The stack is then compressed in a press, by applying a moderate pressure and heating as described previously. Under the effect of the pressure and the temperature, certain organic compounds of the paste break down, other components evaporate, and the silver nanopowder solidifies into a sintered mass. In the vicinity of the outline of the ceramic wafers, any silver paste burrs are spared by the compression, because they jut out from the electrode and/or from the ceramic between which it is arranged. The burrs are therefore spared by the sintering phenomenon, and form a mass that can easily be eliminated, by brushing for example. Depending on its dimensions the stack thus solidified by sintering can be used as central part of a transducer, by simply soldering two side electrodes thereto, or can be recut to form a plurality of unitary stacks intended for different transducers, as illustrated in FIG. 3.

Between each ceramic wafer and each electrode, the mass of sintered silver extends substantially to the edges of the ceramic wafer and of the electrode. This mass of sintered silver possibly forms a slight concavity in the direction of the thickness, because, at the center of the layer of silver (at mid-height of the layer of silver) the pressure needed for the sintering is not reached as far as the edges of the ceramic.

A simple cleaning, for example brush cleaning or a cleaning of light sand-blasting type, of the side faces of the stack, makes it possible to avoid the risks of accidental contact between a separator electrode and the adjacent separator electrode. In the absence of cleaning, such an accidental contact could be caused by "burrs" of the silver paste linking two adjacent separator electrodes. At the end of this "soft" cleaning, a stack is obtained in which the sintered silver layer is still set back relative to the ceramic wafer on which it is deposited, that is to say that the sintered silver layer does not extend beyond the face of the ceramic wafer facing the electrode. A variant embodiment can be envisaged in which the deposition of the silver paste could be done alternately on a ceramic wafer and on an electrode wafer already deposited in the stack. In this case, the extent of the sintered silver layer would be limited to the extent of the ceramic or electrode faces all situated on the same side of the sintered layers.

The sintered silver layer obtained has a remarkable compactness, and a very good cohesion at the interfaces with the ceramic wafer and with the electrode.

Thus, on a section produced at right angles to the ceramic wafers of the stack, the proportion per surface area of voids visible on an image of the sintered layer is less as a percentage than 10%, even less than or equal to 5%. Furthermore, the maximum size of the voids visible on such a cross section is, in most cases, less than or equal to 2 micrometers. A very small quantity of voids is observed at the contact delimiting the boundary between the sintered layer and the ceramic and at the boundary between the sintered layer and the electrode. The proportion of adhesive length of interface between the sintered silver and the other material, on a cross-sectional view, is in both cases greater than or equal to 90%>. The interface voids, like the voids in the mass of the sintered silver, are generally of a size less than or equal to 2 micrometers.

To access the quality of the sintered silver layer, it is possible, for example, to produce a micrographic cross section polished at right angles to the ceramic wafers. On such a micrographic cross section, the observation is preferably performed on a central portion of the stack, for example on a central third of the cut portion of the stack away from the free edges of the stack, in order to avoid observing edge effects, due for example to a decohesion provoked in the handling of the sample with a view to its observation. However, if the observation sample is prepared with care, the same interface quality can be observed as far as the edges of the sample. To facilitate the observation of the voids, it is possible for example to use images obtained by scanning electron microscopy from the electrons backscattered by the sample.

Figure 4:
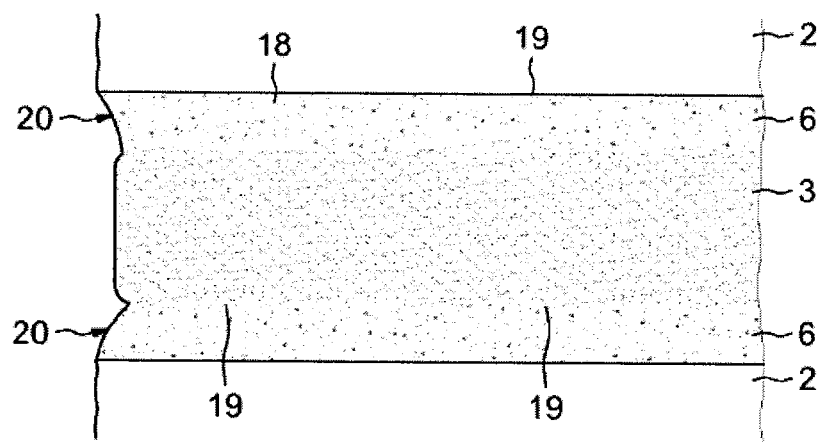
FIG. 4 is a schematic view in cross section of a portion of transducer according to the invention.

FIG. 4 illustrates a cross-sectional schematic view of a portion of transducer at the level of the link layer of sintered silver. The cross section is made at right angles to the ceramic wafers, over a portion of transducer taken for example from the area 40 of FIG. 3. FIG. 4 again shows elements common to FIGS. 1 and 2, the same elements then being designated by the same references. There are once again two ceramic wafers 2 between which is interposed a separator electrode 3. The electrode and the two ceramic wafers are linked by two sintered silver layers 6. The electrode 3 has a rolled metallic structure, for example an annealed silver structure. The sintered silver layers exhibit a few rare voids 18 and adhere almost perfectly to the ceramic wafers 2 and to the electrode 3, except in rare decohesion areas 19. The free surfaces 20 of the sintered silver layer are set back relative to the adjacent ceramic wafers.

The invention is not limited to the exemplary embodiments described, and can be declined into numerous variants. It is possible to coat the ceramic with a metallic tie coat in order to further enhance the adhesion of the sintered silver layer. Such a tie coat may, for example, comprise an undercoat of chromium of the order of a micrometer, as well as a surface undercoat, for example comprising gold, with a thickness of the order of a tenth of a micrometer. The quality of the surface adhesion is then assessed as a function of the adhesion of the sintered silver layer on the tie coat, for example on the layer of gold. The application of the silver paste can also be done alternatively on a ceramic wafer and on an electrode wafer, or systematically on the electrode wafers. The geometry and the mode of assembly of the side electrodes can differ from the abovementioned examples. It is possible, for example, to envisage prolonging the tabs of the separator electrodes so as to be able to solder the end of the tab to the base of a tab protruding through separator electrodes further away, passing at a distance from the adjacent separator electrode.

The method for fabricating the piezoelectric stack is thus both reliable and economical since it makes it possible to tolerate a few defects of flatness and/or of roughness of the ceramic and/or of the separator electrodes, it ensures a good electrical contact, and it limits the residual stresses and stress concentrations at the interfaces between the ceramic wafers and the separator electrodes. Furthermore, this method does not require any operation for repolarizing the piezoelectric ceramics or otherwise electroactive ceramics. The method makes it possible to prepare transducers of large size (width greater than or equal to 15 mm, height greater than or equal to 40 mm) in which the ceramic wafers are brazed with their associated electrodes over their entire contact surface with these electrodes.

The invention claimed is:

1. A method for fabricating a piezoelectric transducer, or an ultrasound transducer, including a stack of planar electrodes between which are interposed ceramic wafers with substantially same surface area as the electrodes, superposed contours of the ceramic wafers and of the electrode wafers defining substantially planar or cylindrical side faces of the stack, the method comprising:
   alternately stacking a ceramic wafer and an electrode wafer, placing between each ceramic wafer and its two adjacent electrodes a composition comprising at least 75% by weight, of silver nanoparticles of a size less than or equal to 80 nanometers; and
   compressing the stack by heating the stack to a temperature less than or equal to 280° C.

2. The method as claimed in claim 1, wherein the composition is a paste.

3. The method as claimed in claim 1, wherein in the compressing is applied unidirectionally, perpendicularly to the ceramic wafers, at a value of between 2 and 20 MPa, for a duration less than or equal to 30 minutes.

4. The method as claimed in claim 1, wherein, after placing the composition on the ceramic, mean temperature of the stack is maintained below 280° C.

5. The method as claimed in claim 1, wherein a support film is coated with the composition, and the film is removed after the coated side of the support film is placed on the ceramic wafer.

6. The method as claimed in claim 1, wherein the electrodes have at least one connection tab dimensioned to extend beyond the stack.

7. The method as claimed in claim 6, wherein square electrodes are used that have four connection tabs, two first tabs on a first face of the square and two second tabs on an opposite second face of the square, in which the stack is produced by staggering each electrode by +−90° relative to a preceding electrode, and wherein an initial stack is then cut into four unitary stacks each including two rows of tabs on two adjacent faces.

8. An ultrasound transducer, comprising:
   a stack of ceramic wafers and separator electrode wafers; and
   a composition placed between the ceramic wafer and its two adjacent electrode wafers,
   wherein the ceramic wafers are at least 1 mm thick,
   wherein the electrode wafers are metallic layers of rolled metal, at least 20 micrometers thick,
   wherein the composition comprises at least 75% by weight of silver nanoparticles of a size less than or equal to 80 nanometers,
   wherein between each ceramic wafer and an adjacent electrode or adjacent electrodes, there is an intermediate layer of silver at least 10 micrometers thick, covering at least 95% of a face of the ceramic wafer arranged facing the electrode, and
   wherein the stack is compressed by heating the stack to a temperature less than or equal to 280° C.

9. The ultrasound transducer as claimed in claim 8, wherein at least one intermediate layer of silver has on average a void ratio less than 10% by surface area on a cross-sectional view at right angles through the ceramic wafers, maximum diameters of the voids being less than or equal to 2 micrometers, and wherein an interface between the ceramic wafer and the layer of silver is free of voids over more than 90% of the interface length.

10. The ultrasound transducer as claimed in claim 8, comprising two side electrodes which are each in electrical contact with one separator electrode in every two, with a single separator electrode adjoining one and a same ceramic wafer, each side electrode having a rippled form, to leave a gap of at least 0.5 mm, between the side electrode and the separator electrodes to which it is not connected.

11. The ultrasound transducer as claimed in claim 8, wherein each separator electrode comprises at least one tab extending beyond the stack, the ultrasound transducer comprising two side electrodes that are each in electrical contact with the tab of one separator electrode in every two.

12. The method as claimed in claim 1, wherein the temperature is between 200° C. and 250° C.

* * * * *